United States Patent
Chang et al.

(10) Patent No.: US 10,497,773 B2
(45) Date of Patent: Dec. 3, 2019

(54) METHOD TO IMPROVE MIM DEVICE PERFORMANCE

(71) Applicant: Taiwan Semiconductor Manufacturing Co., Ltd., Hsin-Chu (TW)

(72) Inventors: Yao-Wen Chang, Taipei (TW); Hsing-Lien Lin, Hsin-Chu (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/230,204

(22) Filed: Mar. 31, 2014

(65) Prior Publication Data
US 2015/0279922 A1 Oct. 1, 2015

(51) Int. Cl.
*H01L 49/02* (2006.01)
*H01L 21/02* (2006.01)
*H01L 21/321* (2006.01)

(52) U.S. Cl.
CPC ........ *H01L 28/60* (2013.01); *H01L 21/0228* (2013.01); *H01L 21/02189* (2013.01);
(Continued)

(58) Field of Classification Search
CPC .................... H01L 21/02304; H01L 28/56
See application file for complete search history.

(56) References Cited

U.S. PATENT DOCUMENTS 5,910,218 A * 6/1999 Park ................... C23C 16/405
                                                   118/719
6,114,051 A    9/2000 Timmer et al.
(Continued)

FOREIGN PATENT DOCUMENTS

KR      20030050949 A  *  6/2003

OTHER PUBLICATIONS

Material Safety Data Sheet: Tetrakis(ethylmethylamido)zirconium(IV). Apr. 18, 2008.*
(Continued)

*Primary Examiner* — Cuong Q Nguyen
*Assistant Examiner* — Peter M Albrect
(74) *Attorney, Agent, or Firm* — Eschweiler & Potashnik, LLC (57) ABSTRACT

The present disclosure relates to a method of forming a MIM (metal-insulator-metal) capacitor using a post capacitor bottom metal (CBM) treatment process to reduce a roughness of a top surface of a capacitor bottom metal layer, and an associated apparatus. In some embodiments, the method is performed by forming a capacitor bottom metal layer having a first metal material over a semiconductor substrate. A top surface of the capacitor bottom metal layer is exposed to one or more post CBM treatment agents having oxygen. The one or more post CBM treatment agents reduce a roughness of the top surface and form an interface layer having the first metal material and oxygen onto and in direct contact with the top surface of the capacitor bottom metal layer. A capacitor dielectric layer is formed over the interface layer and a capacitor top metal layer is formed over the capacitor dielectric layer.

20 Claims, 6 Drawing Sheets

(52) U.S. Cl.
CPC .. *H01L 21/02244* (2013.01); *H01L 21/02252* (2013.01); *H01L 21/02255* (2013.01); *H01L 21/02304* (2013.01); *H01L 21/32115* (2013.01)

(56) References Cited

U.S. PATENT DOCUMENTS

| | | | |
|---|---|---|---|
| 6,303,427 B1* | 10/2001 | Song | H01L 28/60 257/E21.008 |
| 6,334,964 B1 | 1/2002 | Cowman et al. | |
| 6,740,553 B1* | 5/2004 | Lee | H01L 21/3145 257/E21.008 |
| 6,759,703 B1 | 7/2004 | Matsuhashi | |
| 6,812,088 B1 | 11/2004 | Chen et al. | |
| 6,821,839 B2* | 11/2004 | Chung | H01L 28/75 257/E21.011 |
| 6,972,265 B1 | 12/2005 | Schwarz | |
| 7,078,785 B2* | 7/2006 | Ciancio | H01L 23/5223 257/306 |
| 7,301,752 B2 | 11/2007 | Coolbaugh et al. | |
| 7,335,569 B2* | 2/2008 | Senzaki | C23C 16/308 257/532 |
| 2001/0014510 A1* | 8/2001 | Park | C23C 16/308 438/396 |
| 2002/0052101 A1* | 5/2002 | Yang | H01L 21/28123 438/586 |
| 2002/0071237 A1 | 6/2002 | Adler | |
| 2003/0011014 A1* | 1/2003 | Basceri | H01L 28/75 257/310 |
| 2003/0049943 A1* | 3/2003 | Choi | C23C 16/405 438/785 |
| 2004/0084701 A1 | 5/2004 | Kanaya et al. | |
| 2004/0169211 A1 | 9/2004 | Zhuang et al. | |
| 2004/0222493 A1* | 11/2004 | Sato | H01G 4/005 257/532 |
| 2005/0062130 A1 | 3/2005 | Ciancio et al. | |
| 2006/0145293 A1 | 7/2006 | Cho | |
| 2006/0183280 A1 | 8/2006 | Lee et al. | |
| 2006/0197183 A1 | 9/2006 | Yang et al. | |
| 2006/0292815 A1 | 12/2006 | Roberts et al. | |
| 2007/0034924 A1 | 2/2007 | Takewaki et al. | |
| 2008/0318378 A1* | 12/2008 | Wu | H01L 27/10852 438/253 |
| 2009/0014835 A1 | 1/2009 | Furumiya et al. | |
| 2009/0047798 A1* | 2/2009 | Clark | C23C 16/40 438/778 |
| 2009/0246971 A1* | 10/2009 | Reid | C23C 16/02 438/778 |
| 2009/0267187 A1 | 10/2009 | Hose et al. | |
| 2011/0108951 A1* | 5/2011 | Cho | H01L 21/31144 257/532 |
| 2011/0227195 A1 | 9/2011 | Horng et al. | |
| 2013/0200490 A1* | 8/2013 | Lin | H01L 28/40 257/532 |
| 2014/0264751 A1 | 9/2014 | Chen et al. | |
| 2014/0273396 A1* | 9/2014 | Liebau | H01L 28/40 438/399 |
| 2015/0072441 A1 | 3/2015 | Sun | |

OTHER PUBLICATIONS

Deok-Sin Kil, et al., "Improvement of Leakage Current Property of TIT Capacitor with Compositionally Stepped Thin Films," Electronic Materials Letters, vol. 2, No. 1, p. 15-18, 2006.
Non Final Office Action dated Oct. 30, 2015 U.S. Appl. No. 14/591,981.
U.S. Appl. No. 14/450,532, filed Aug. 4, 2014.
U.S. Appl. No. 14/591,981, filed Jan. 8, 2015.
Yang-Kyu Choi, et al.; "Investigation of Gate-Induced Drain Leakage (GIDL) Current in Thin Body Devices: Single-Gate Ultra-Thin Body, Symmetrical Double-Gate, and Asymmetrical Double-Gate MOSFETs"; Jpn. J. Appl. Phys. vol. 42 (2003), p. 2073-2076.
Notice of Allowance dated Oct. 5, 2015 U.S. Appl. No. 14/450,532.
Non-Final Office Action dated Jul. 1, 2015 for U.S. Appl. No. 14/450,532.
Non Final Office Action dated Oct. 20, 2016 U.S. Appl. No. 14/591,981.
Final Office Action dated Jul. 8, 2016 U.S. Appl. No. 14/591,981.
Final Office Action dated Mar. 3, 2017 for U.S. Appl. No. 14/591,981.
Notice of Allowance dated Jun. 12, 2017 in connection with U.S. Appl. No. 14/591,981.

* cited by examiner

METHOD TO IMPROVE MIM DEVICE PERFORMANCE

BACKGROUND

Integrated chips comprise millions or billions of transistor devices, which are configured to act as switches and/or to produce power gains so as to enable logical functionality for an integrated chip (e.g., form a processor configured to perform logic functions). Integrated chips often also comprise passive devices, such as capacitors, resistors, inductors, varactors, etc. Passive devices are widely used to control integrated chip characteristics (e.g., gain, time constants, etc.) and to provide an integrated chip with a wide range of different functionalities (e.g., manufacturing analog and digital circuitry on a same die). MIM (metal-insulator-metal) capacitors are a particular type of capacitor, having a top metal plate and a bottom metal plate separated by an insulating material, which are often integrated into the back-end-of-the-line metal interconnect layers of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are a particular type of capacitor, having a top metal plate and a bottom metal plate separated by a capacitor dielectric layer, which are often implemented into the back-end-of-the line (BEOL) metal interconnect layers of integrated circuits. Often the bottom electrode of a MIM capacitor is formed by physical vapor deposition (PVD). However, when some materials (e.g., titanium nitride, tantalum nitride, etc.) are deposited by physical vapor deposition column-like structures separated by gaps (i.e., grain boundaries) form in the deposited film.

The column-like structures cause the capacitor bottom metal layer to have a top surface with an uneven topography (i.e., a rough top surface). The uneven topography causes protrusions from the capacitor bottom metal layer to extend into the overlying capacitor dielectric layer. Such protrusions cause localized thinning of the capacitor dielectric layer that reduces a distance between the capacitor bottom metal layer and the capacitor top metal layer. Such local thinning of the capacitor dielectric layer can lead to voltage induced breakdown of the capacitor dielectric material and device failure.

Accordingly, the present disclosure relates to a method of forming a MIM (metal-insulator-metal) capacitor using a post capacitor bottom metal (CBM) treatment process to reduce a roughness of a top surface of a capacitor bottom metal layer, and an associated apparatus. In some embodiments, the method comprises forming a capacitor bottom metal layer having a first metal material over a semiconductor substrate. A top surface of the capacitor bottom metal layer is exposed to one or more post capacitor bottom metal (CBM) treatment agents comprising oxygen. The one or more post CBM treatment agents are configured to reduce a roughness of the top surface and to form an interface layer comprising the first metal material and oxygen onto and in direct contact with the top surface of the capacitor bottom metal layer. A capacitor dielectric layer is formed over the interface layer and a capacitor top metal layer is formed over the capacitor dielectric layer. By using the post CBM treatment agent to reduce a roughness of the capacitor bottom metal layer, dielectric breakdowns associated with localized thinning of the capacitor dielectric layer can be mitigated.

Figure 1:
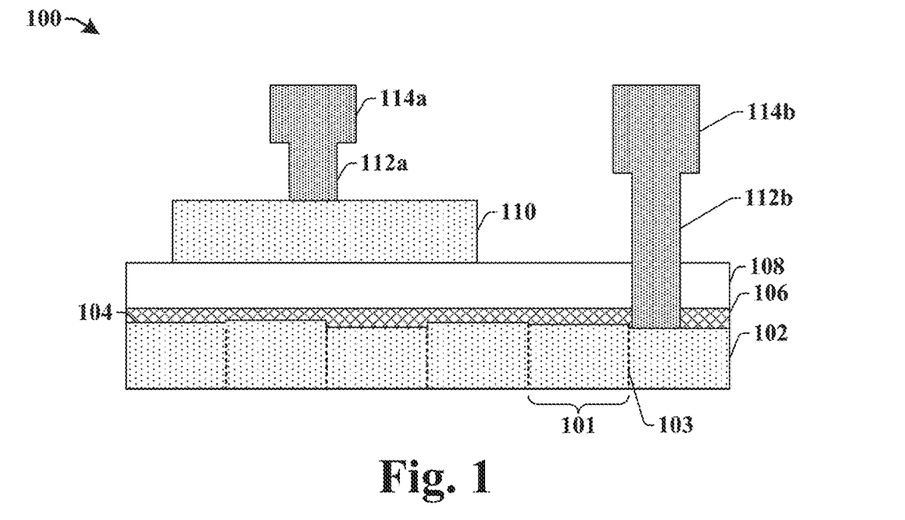
FIG. 1 illustrates a cross-sectional view of some embodiments of a metal-insulator-metal (MIM) capacitor having an interface layer disposed between a capacitor bottom metal layer and a capacitor dielectric layer.

FIG. 1 illustrates a cross-sectional view of some embodiments of a metal-insulator-metal (MIM) capacitor 100 having an interface layer 106 disposed between a capacitor bottom metal layer 102 and a capacitor dielectric layer 108.

The MIM capacitor 100 comprises a capacitor bottom metal layer 102. The capacitor bottom metal layer 102 comprises a first metal material. In various embodiments, the capacitor bottom metal layer 102 may comprise a titanium nitride (TiN) layer having a first metal material comprising titanium, or a tantalum nitride (TaN) layer having a first metal material comprising tantalum. The capacitor bottom metal layer 102 comprises a plurality of column-like structures 101 separated by grain boundaries 103 (i.e., gaps). The separate column-like structures 101 cause a top surface 104 of the capacitor bottom metal layer 102 to have a topography that varies in height as a function of position. For example, in some embodiments, the top surface 104 of the capacitor bottom metal layer 102 may have variations in height in a range of between approximately 3 angstroms and approximately 6 angstroms.

An interface layer 106 is disposed onto and in direct contact with a top surface 104 of the capacitor bottom metal layer 102. The interface layer 106 comprises oxygen and the first metal material of the capacitor bottom metal layer 102. For example, in some embodiments wherein the capacitor bottom metal layer 102 comprises titanium nitride (TiN), the interface layer 106 may comprise titanium oxide ($TiO_x$). In some embodiments, the interface layer 106 may have a first dielectric constant $\kappa_1$.

A capacitor dielectric layer 108 is disposed over the interface layer 106. The capacitor dielectric layer 108 is configured to electrically separate the capacitor bottom metal layer 102 from an overlying capacitor top metal layer 110. By separating the capacitor bottom metal layer 102 from the capacitor top metal layer 110, the MIM capacitor 100 is able to store energy in an electric field generated between the capacitor bottom metal layer 102 and the capacitor top metal layer 110. In some embodiments, the capacitor dielectric layer 108 may comprise a high-k dielectric material (i.e., a dielectric material having a dielectric constant greater than silicon dioxide). In some embodiments, the capacitor dielectric layer 108 has a second dielectric constant $\kappa_2$ that is different than the first dielectric constant $\kappa_1$. For example, in some embodiments, the capacitor dielectric layer 108 has a second dielectric constant $\kappa_2$ that is smaller than the first dielectric constant $\kappa_1$. In such embodiments, the interface layer 106 causes MIM capacitor 100 to have a higher capacitance than a MIM capacitor that does not have the interface layer 106.

MIM capacitor 100 further comprises a first metal via 112a and a second metal via 112b configured to provide electrical connections to the capacitor top metal layer 110 and the capacitor bottom metal layer 102, respectively. The first metal via 112a vertically extends from a first metal wire 114a to a top surface of the capacitor top metal layer 110. The second metal via 112b vertically extends from a second metal wire 114b to the top surface 104 of the capacitor bottom metal layer 102.

Figure 2:
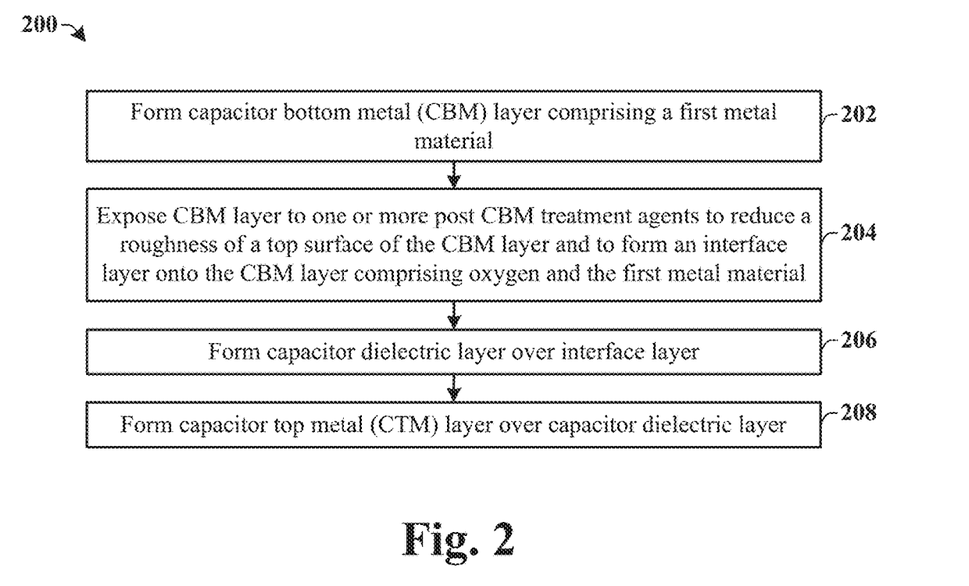
FIG. 2 illustrates a flow diagram of some embodiments of a method of forming a MIM capacitor that uses a post capacitor bottom metal (CBM) treatment process to reduce a roughness of a top surface of a capacitor bottom metal layer.

FIG. 2 illustrates a flow diagram of some embodiments of a method 200 of forming a MIM capacitor that uses a post capacitor bottom metal (CBM) treatment process to form an interface layer over a capacitor bottom metal layer.

At 202, a capacitor bottom metal layer comprising a first metal material is formed. In some embodiments, the capacitor bottom metal layer may be formed using a physical vapor deposition (PVD) process. The PVD process results in the formation of column-like structures within the capacitor bottom metal layer. The column-like structures provide the capacitor bottom metal layer with an uneven top surface.

At 204, a top surface of the capacitor bottom metal layer is exposed to one or more post capacitor bottom metal (CBM) treatment agents comprising oxygen. Exposing the top surface of the capacitor bottom metal layer to the one or more CBM treatment agents reduces a roughness of the capacitor bottom metal layer. Exposing the top surface of the capacitor bottom metal layer to the one or more CBM treatment agents also forms an interface layer onto and in direct contact with the top surface of the capacitor bottom metal layer. The interface layer comprises the first metal material and oxygen.

At 206, a capacitor dielectric layer is formed over the interface layer.

At 208, a capacitor top metal layer is formed over the capacitor dielectric layer.

Therefore, by exposing the capacitor bottom metal layer to a post CBM treatment agent, method 200 reduces a roughness of the top surface of the capacitor bottom metal layer to mitigate dielectric breakdowns associated with localized thinning of the capacitor dielectric layer.

Figure 3:
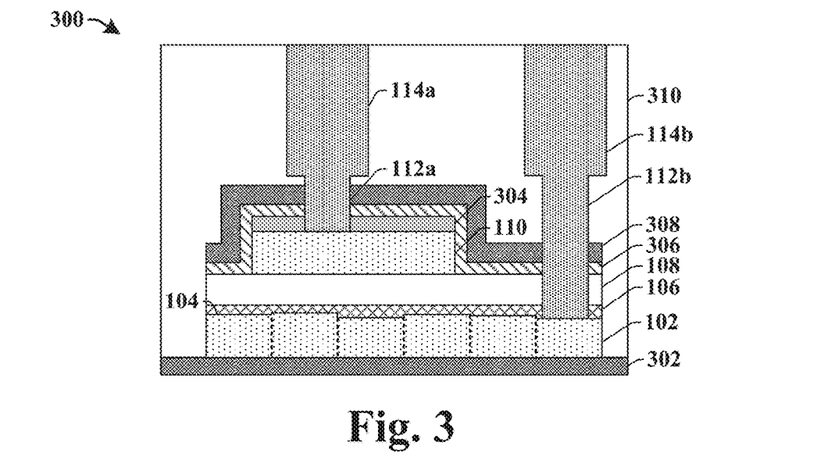
FIG. 3 illustrates a cross-sectional view of some additional embodiments of a MIM capacitor having an interface layer disposed between a capacitor bottom metal layer and a capacitor dielectric layer.

FIG. 3 illustrates a cross-sectional view of some additional embodiments of a MIM capacitor 300 having an interface layer 106 disposed over a capacitor bottom metal layer 102.

The MIM capacitor 300 comprises a capacitor bottom metal layer 102 comprising a first metal material disposed over a first etch stop layer 302. The first etch stop layer 302 may disposed onto a lower metal interconnect layer (not shown) surrounded by lower inter-level dielectric (ILD) layer within a BEOL metallization stack. In some embodiments, the lower metal interconnect layer may comprise one of a plurality of metal interconnect layers disposed between the first etch stop layer 302 and an underlying semiconductor substrate (not shown).

An interface layer 106 is disposed onto and in direct contact with a top surface of the capacitor bottom metal layer 102. The interface layer 106 comprises oxygen and the first metal material. In some embodiments, the interface layer 106 may further comprise nitrogen. For example, in some embodiments the capacitor bottom metal layer 102 may comprise titanium nitride (TiN) or tantalum nitride (TaN), while the interface layer 106 may comprise titanium oxide ($TiO_x$) or tantalum oxide ($TaO_x$). In other embodiments, the capacitor bottom metal layer 102 may comprise titanium nitride (TiN) or tantalum nitride (TaN), while the interface layer 106 may comprise titanium oxy-nitride (TiON) or tantalum oxy-nitride (TaON).

The capacitor bottom metal layer 102 is separated from a capacitor top metal layer 110 by a capacitor dielectric layer 108. In various embodiments, the capacitor dielectric layer 108 may comprise a high-k dielectric material such as silicon nitride ($Si_3N_4$), aluminum oxide ($Al_2O_3$), tantalum oxide ($Ta_2O_5$), titanium oxide ($TiO_2$), zirconium oxide ($ZrO_2$), or hafnium oxide ($HfO_2$), for example.

In some embodiments, a masking layer 304 is disposed over the capacitor top metal layer 110. In some embodiments, the masking layer 304 may comprise silicon nitride (SiN), protective silicon oxy-nitride (PE-SiON), or silicon carbide (SiC). A capping layer 306 (e.g., a dielectric) may be disposed over the capacitor top metal layer 110 and the capacitor dielectric layer 108. In some embodiments, the capping layer 306 may comprise an oxide layer, for example. In some embodiments, a second etch stop layer 308 may be disposed over the capping layer 306. In some embodiments, the second etch stop layer 308 may comprise silicon nitride (SiN), silicon oxy-nitride (SiON), or silicon carbide (SiC), for example. In some embodiments, the MIM capacitor further comprises an inter-level dielectric (ILD) layer 310 (e.g., an oxide, a low-k dielectric, an ultra low-k dielectric, etc.) disposed over the second etch stop layer 308.

Figure 4:
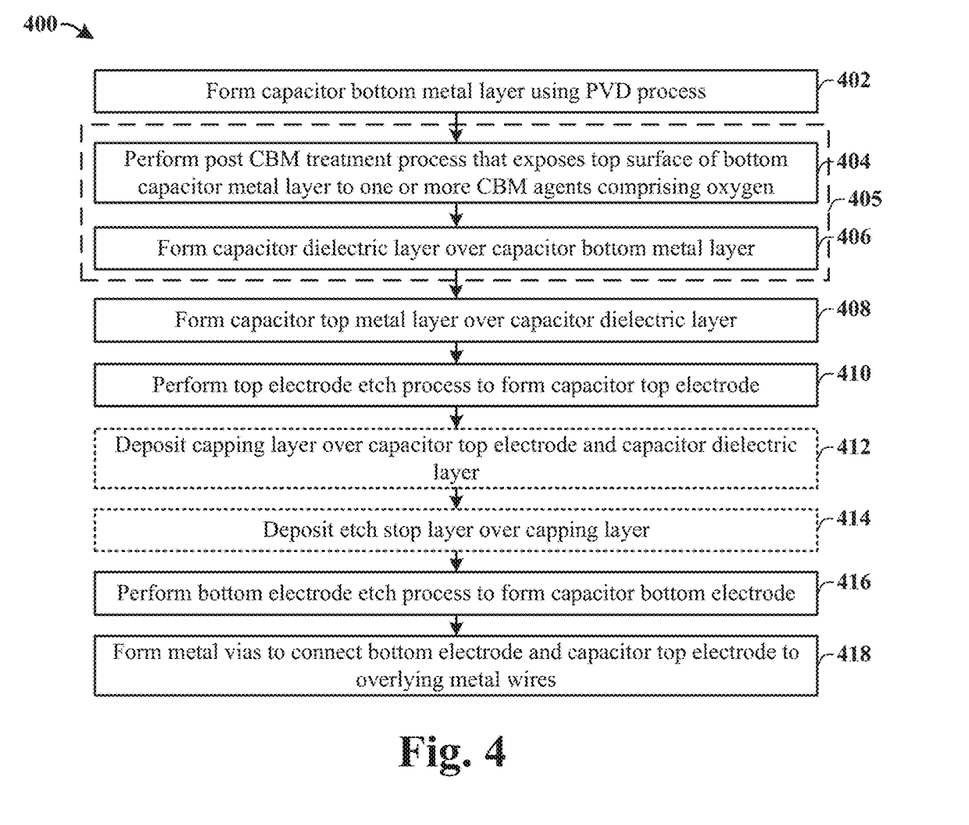
FIG. 4 illustrates a flow diagram of some additional embodiments of a method of forming a MIM capacitor that uses a post CBM treatment process to reduce a roughness of a top surface of a capacitor bottom metal layer.

FIG. 4 illustrates a flow diagram of some additional embodiments of a method 400 of forming a MIM capacitor that uses a post capacitor bottom metal (CBM) treatment process to reduce a roughness of a top surface of a capacitor bottom metal layer.

While the disclosed methods (e.g., methods 200 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a capacitor bottom metal layer is formed by way of a physical vapor deposition (PVD) process.

At 404, a post capacitor bottom metal (CBM) treatment process is performed. The post CBM treatment process exposes a top surface of the capacitor bottom metal layer to one or more CBM agents comprising oxygen. The one or more CBM agents are configured to reduce a roughness of the top surface of the capacitor bottom metal layer and to form an interface layer onto the top surface of the capacitor bottom metal layer.

In some embodiments, the post CBM treatment process may expose the capacitor bottom metal layer to a CBM agent comprising an ozone ($O_3$) gas at an elevated temperature. In other embodiments, the post CBM treatment process may expose the capacitor bottom metal layer to a CBM agent comprising a nitrous-oxide ($N_2O$) plasma and/or an oxygen ($O_2$) plasma. In yet other embodiments, the post CBM treatment process may expose the capacitor bottom metal layer to a first CBM agent comprising an ozone ($O_3$) gas and a second CBM agent comprising nitrous-oxide ($N_2O$) plasma and/or an oxygen ($O_2$) plasma.

At 406, a capacitor dielectric layer is formed over the capacitor bottom metal layer. In some embodiments, the capacitor dielectric layer may be formed in-situ process (i.e., without breaking the low pressure ambient) with the post CBM treatment process, as shown by box 405.

At 408, a capacitor top metal layer is formed over the capacitor dielectric layer.

At 410, a top electrode etch process is performed to pattern the capacitor top metal layer to form a capacitor top electrode.

At 412, a capping layer may be formed over the capacitor top electrode and the capacitor dielectric layer.

At 414, an etch stop layer may be formed over the capping layer.

At 416, a bottom electrode etch process is performed to pattern the capacitor bottom metal layer to form a capacitor bottom electrode. The bottom electrode etch process may also pattern the capacitor dielectric layer, the capping layer, and/or the etch stop layer.

At 418, metal vias are formed to connect the capacitor bottom electrode and the capacitor top electrode to overlying metal wires.

FIGS. 5-12 illustrate some embodiments of cross-sectional views showing a method of forming a MIM capacitor using a post capacitor bottom metal (CBM) treatment process. Although FIGS. 5-12 are described in relation to method 400, it will be appreciated that the structures disclosed in FIGS. 5-12 are not limited to such a method, but instead may stand alone as structures independent of the method.

Figure 5:
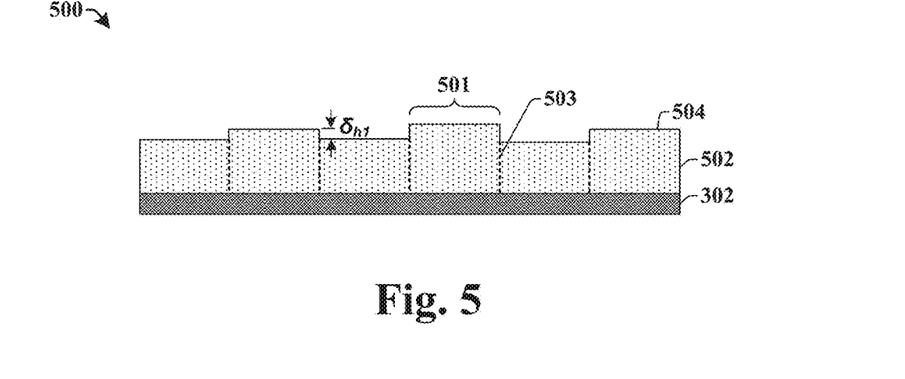
FIGS. 5-12 illustrate some embodiments of cross-sectional views showing a method of forming a MIM capacitor using a post CBM treatment process.

FIG. 5 illustrates some embodiments of a cross-sectional view 500 corresponding to act 402.

As shown in cross-sectional view 500, a capacitor bottom metal layer 502 is formed. The capacitor bottom metal layer 502 may be deposited by way of a physical vapor deposition (PVD) process. The PVD process forms column-like structures 501 separated by grain boundaries 503. The column-like structures 501 cause a top surface 504 of the capacitor bottom metal layer 502 to have a first variation $\delta_{h1}$ in height between a lowest point and an uppermost point (i.e., a roughness). In some embodiments, the first variation $\delta_{h1}$ in height may have a range of between approximately 8 angstroms and approximately 10 angstroms.

In some embodiments, the capacitor bottom metal layer 502 may comprise titanium nitride (TiN) or tantalum nitride (TaN). In some embodiments, the capacitor bottom metal layer 502 may be deposited by way of a multi-step deposition process. In some embodiments, the capacitor bottom metal layer 502 may be deposited over a first etch stop layer 302 disposed over an underlying inter-level dielectric (ILD) layer (not shown). In some embodiments, the first etch stop layer 302 may comprise silicon carbide (SiC), for example.

Figure 6:
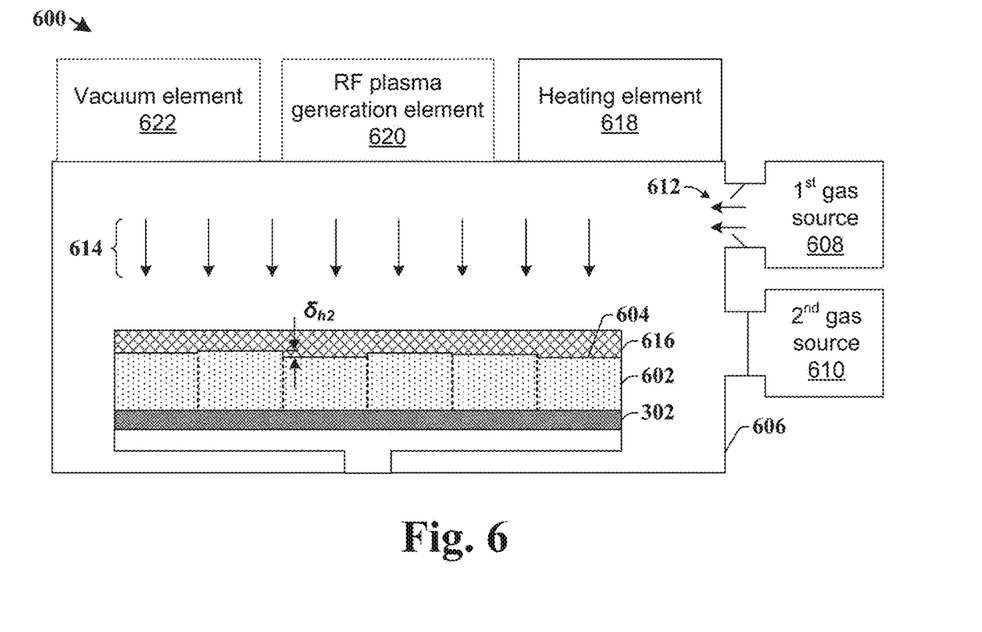

FIG. 6 illustrates some embodiments of a cross-sectional view 600 corresponding to act 404.

As shown in cross-sectional view 600, a post capacitor bottom metal (CBM) treatment process is performed on the capacitor bottom metal layer 602. The post CBM treatment process exposes the top surface 604 of the capacitor bottom metal layer 602 to one or more post capacitor bottom metal (CBM) treatment agents 614 having oxygen. In some embodiments, the one or more post CBM treatment agents 614 may comprise ozone ($O_3$). In other embodiments, the one or more post CBM treatment agents 614 may comprise nitrous-oxide ($N_2O$). In yet other embodiments, the one or more post CBM treatment agents 614 may comprise ozone ($O_3$) and nitrous-oxide ($N_2O$).

The one or more post CBM treatment agents 614 are configured to reduce a roughness of the top surface 604 of the capacitor bottom metal layer 602. For example, the one or more post CBM treatment agents 614 are configured to cause the top surface of the capacitor bottom metal layer 602 to have a second variation $\delta_{h2}$ in height that is smaller than the first variation $\delta_{h1}$ in height. In some embodiments, the second variation $\delta_{h2}$ in height may have a range of between approximately 3 angstroms and approximately 7 angstroms. The one or more post CBM treatment agents 614 are further configured to form an interface layer 616 comprising oxygen onto the top surface 604 of the capacitor bottom metal layer 602. In some embodiments, the interface layer 616 may comprise titanium oxide ($TiO_x$), titanium oxy-nitride (TiON), tantalum oxide ($TaO_x$), or tantalum oxy-nitride (TaON). In such embodiments, the interface layer 616 has a relatively high dielectric constant, which will increase the capacitance of a resulting MIM capacitor.

In some embodiments, the post CBM treatment process may be performed by providing a semiconductor substrate comprising the capacitor bottom metal layer 602 into a processing chamber 606. A heating element 618 is configured to increase a temperature of the processing chamber 606. For example, in some embodiments the processing chamber 606 may comprise a furnace tube having a heating element 618 configured to provide for a high temperature ambient within the furnace tube. In some embodiments, a vacuum element 622 may be configured to generate a low pressure ambient within the processing chamber 606.

The processing chamber 606 is connected to a first gas source 608 configured to provide a gas 612 comprising oxygen into the processing chamber 606. In some embodiments, the first gas source 608 may be configured to provide ozone gas ($O_3$) into the processing chamber 606. In such embodiments, the post CBM treatment process may be performed by introducing the ozone gas ($O_3$) into the processing chamber 606, and increasing the temperature within the processing chamber 606. The ozone gas ($O_3$) acts as a post CBM treatment agent 614 configured to contact the top surface 604 of the capacitor bottom metal layer 602 to form the interface layer 616. In some embodiments, the post CBM treatment process may expose the capacitor bottom metal layer 602 to the ozone gas ($O_3$) for a time in a range of between approximately 50 seconds and approximately 150 seconds at a temperature of greater than or equal to approximately 210° C.

In some embodiments, an radio frequency (RF) plasma generation element 620 may be configured to generate a plasma within the processing chamber 606. In some such embodiments, the post CBM process may be performed by operating the first gas source 608 to provide nitrous-oxide ($N_2O$) gas into the processing chamber 606, and by operating the RF plasma generation element 620 to generate a nitrous-oxide ($N_2O$) plasma from the nitrous-oxide ($N_2O$) gas. The nitrous-oxide ($N_2O$) plasma acts as a post CBM treatment agent 614 configured to contact the top surface 604 of the capacitor bottom metal layer 602 to form the interface layer 616. In other such embodiments, the post CBM process may be performed by operating the first gas source 608 to provide oxygen ($O_2$) gas into the processing chamber 606, and by operating the RF plasma generation element 620 to generate an oxygen ($O_2$) plasma that acts as a post CBM treatment agent 614.

In some embodiments, the post CBM treatment process may expose the top surface 604 of the capacitor bottom metal layer 602 to a nitrous-oxide ($N_2O$) plasma for a time in a range of between approximately 20 seconds and approximately 100 seconds. In some embodiments, an increased exposure time may reduce the roughness of the top surface 604 of the capacitor bottom metal layer 602. In some embodiments, the plasma may be formed using a nitrous-oxide ($N_2O$) gas flow rate of greater than approximately 10,000 sccm (standard cubic centimeter per minute) and an RF power of greater than approximately 400 W. In some embodiments, the plasma may be formed using a nitrous-oxide ($N_2O$) gas flow rate of greater than or equal to approximately 18,000 sccm and an RF power of greater than or equal to approximately 1,800 W. The higher nitrous-oxide ($N_2O$) gas flow rate and RF power cause the top surface 104 of the capacitor bottom metal layer 102 to have a low roughness and provide for a high quality oxide that gives a resulting MIM capacitor a low leakage current. In some embodiments, the processing chamber 606 may be held at a temperature greater than or equal to approximately 400° C. during the formation of the nitrous-oxide ($N_2O$) plasma.

Figure 7:
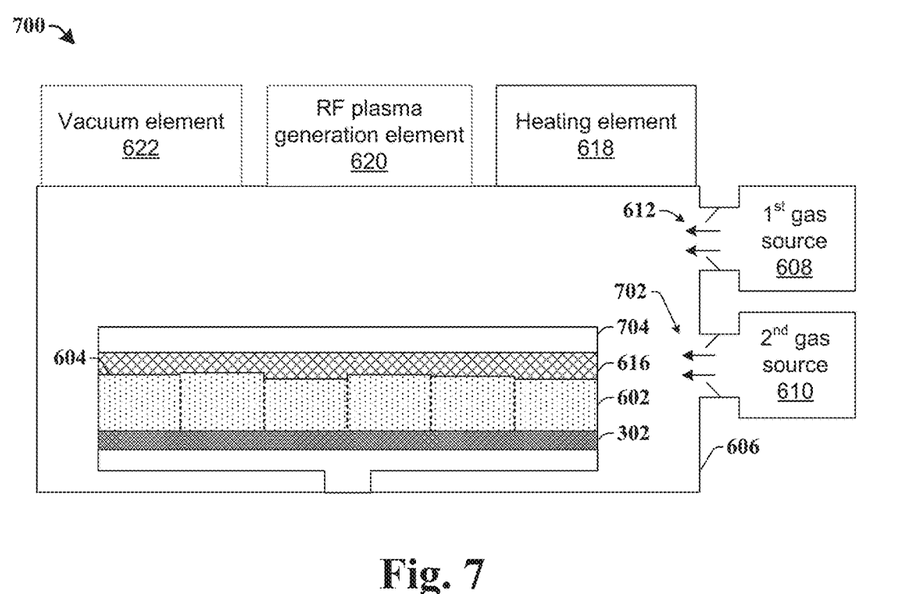

FIG. 7 illustrates some embodiments of a cross-sectional view 700 corresponding to act 406.

As shown in cross-sectional view 700, a capacitor dielectric layer 704 is formed onto and in direct contact with the interface layer 616. Because of the reduced roughness of the top surface 604 of the capacitor bottom metal layer 602, the capacitor dielectric layer 704 can be formed to a relatively small thickness without experiencing dielectric breakdown due to localized thinning of the capacitor dielectric layer 704. For example, in some embodiments the capacitor dielectric layer 704 may be formed by an atomic layer deposition (ALD) process to a thickness in a range of between approximately 50 angstroms and approximately 100 angstroms.

In some embodiments, the capacitor dielectric layer 704 may be formed in-situ with the post CBM treatment process. For example, in some embodiments, the post CBM treatment process may be performed within processing chamber 606. In such embodiments, after conclusion of the post CBM treatment process a second gas source 610 is configured to introduce one or more additional gases 702 into the processing chamber 606. For example, in some embodiments during the post CBM treatment process the first gas source 608 may introduce an ozone gas ($O_3$) into the processing chamber 606, while during the formation of the capacitor dielectric layer 704 the second gas source 610 may additionally introduce a precursor gas comprising TEMAZr (Tetrakis(ethylmethylamido)zirconium) into the processing chamber 606. The TEMAZr and ozone gas ($O_3$) interact to form a capacitor dielectric layer 704 comprising zirconium oxide ($ZrO_2$) onto the interface layer 616.

Figure 8:
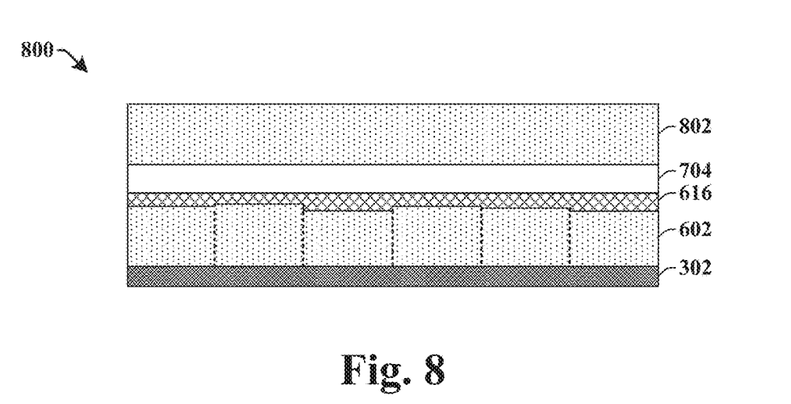

FIG. 8 illustrates some embodiments of a cross-sectional view 800 corresponding to act 408.

As shown in cross-sectional view 800, a capacitor top metal layer 802 is formed over the capacitor dielectric layer 704. In some embodiments, the capacitor top metal layer 802 may comprise titanium nitride (TiN) or tantalum nitride (TaN), for example. In some embodiments, the capacitor top metal layer 802 may be formed by way of a vapor deposition process (e.g., physical vapor deposition, chemical vapor deposition, etc.).

Figure 9:
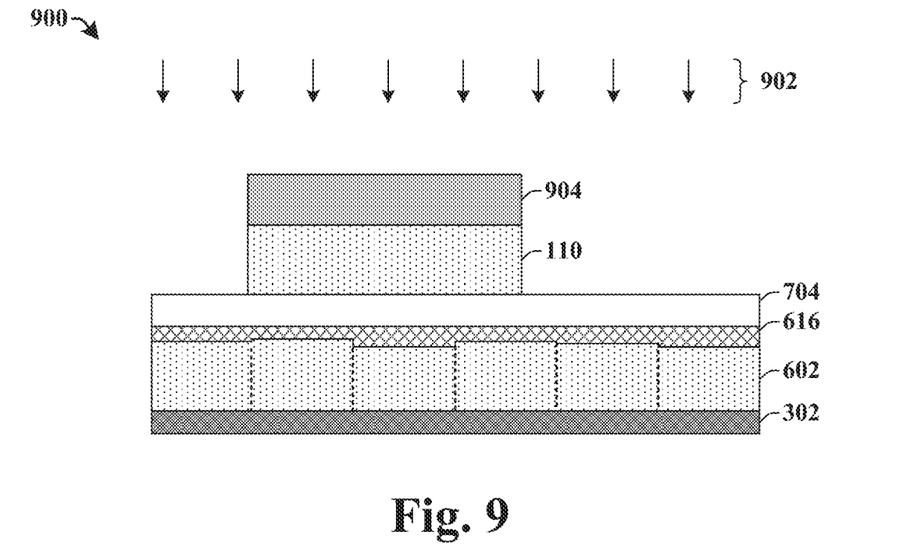

FIG. 9 illustrates some embodiments of a cross-sectional view 900 corresponding to act 410.

As shown in cross-sectional view 900, a masking layer 904 is formed over a part of the capacitor top metal layer 110 to define a top electrode of the MIM capacitor. In some embodiments, the masking layer 904 may comprise a hard mask material. For example, the masking layer 904 may comprise a protective silicon oxy-nitride (PE-SiON) layer deposited by a plasma enhanced chemical vapor deposition technique.

A top electrode etching process is subsequently performed by selectively exposing the capacitor top metal layer to an etchant 902 in areas not covered by the masking layer 904. The etchant 902 defines a top electrode by removing unmasked areas of the capacitor top metal layer 110. In some embodiments, the etchant 902 may comprise a dry etchant (e.g., a plasma etchant, an RIE etchant, etc.).

Figure 10:
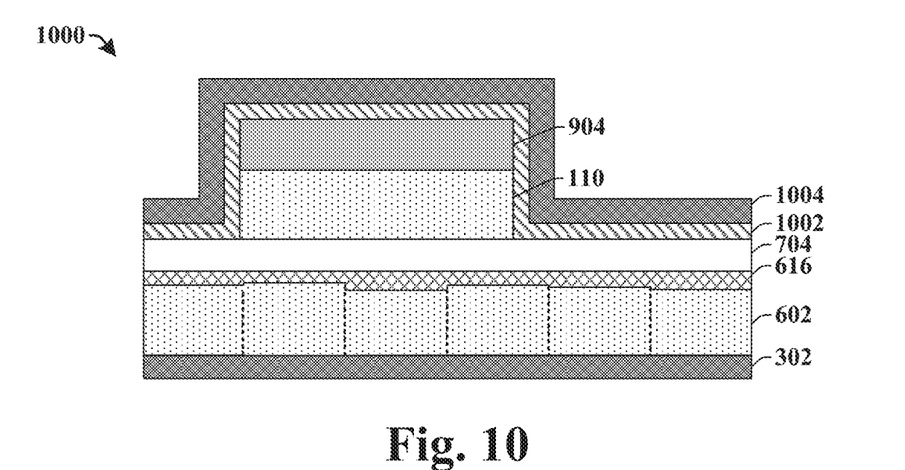

FIG. 10 illustrates some embodiments of a cross-sectional view 1000 corresponding to acts 412-414.

As shown in cross-sectional view 1000, a capping layer 1002 is deposited onto the masking layer 904 and the capacitor dielectric layer 704. In some embodiments, the capping layer 1002 may comprise an oxide, for example. A second etch stop layer 1004 is deposited onto the capping layer 1002. In some embodiments, the second etch stop layer 1004 may comprise silicon nitride (SiN), for example. In some embodiments, the capping layer 1002 and the second etch stop layer 1004 may be deposited by way of a vapor deposition process (e.g., physical vapor deposition, chemical vapor deposition, etc.)

Figure 11:
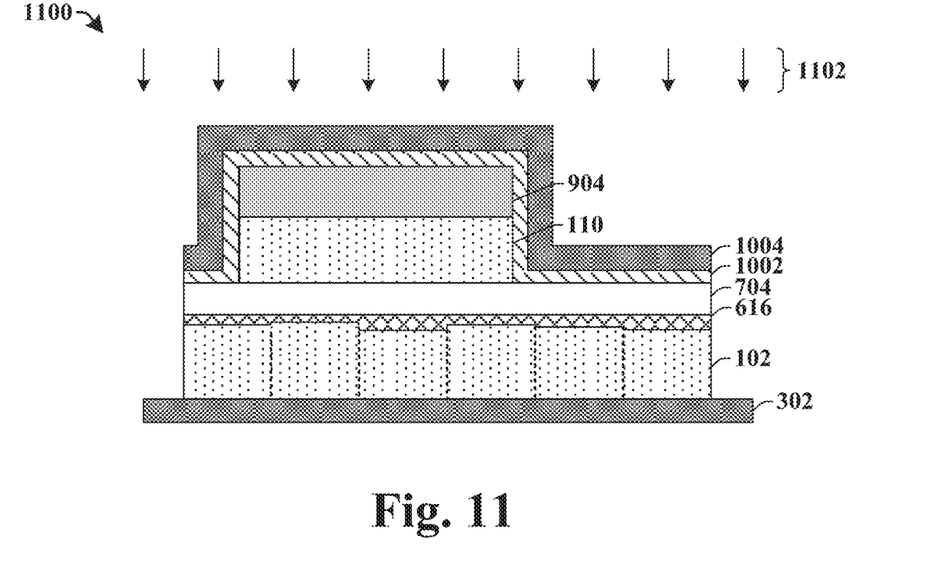

FIG. 11 illustrates some embodiments of a cross-sectional view 1100 corresponding to act 414.

As shown in cross-sectional view 1100, a bottom electrode etching process is performed by selectively exposing the capacitor bottom metal layer 102 to an etchant 1102. The etchant 1102 defines a bottom electrode by removing portions of the capacitor bottom metal layer 102. In some embodiments, the etchant 1102 may comprise a dry etchant (e.g., a plasma etchant, an RIE etchant, etc.).

Figure 12:
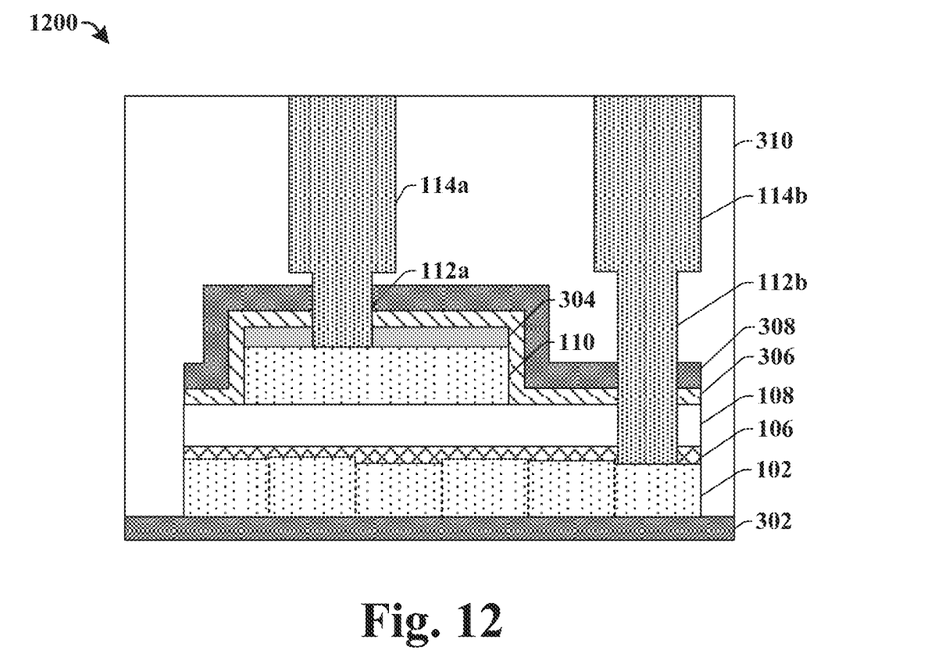

FIG. 12 illustrates some embodiments of a cross-sectional view 1200 corresponding to act 416.

As shown in cross-sectional view 1200, a first metal via 112a and a second metal via 112b are formed to electrically connect metal wires, 114a and 114b, to the capacitor top metal layer 110 and the capacitor bottom metal layer 102, respectively. The first and second vias, 112a and 112b, may be formed by depositing an inter-level dielectric (ILD) layer 310 over the second etch stop layer 308. A via etching process (e.g., a dry etching process) is performed to form openings that extend from a top of the ILD layer 310 to the capacitor top metal layer 110 and the capacitor bottom metal layer 102. A metal (e.g., copper, tungsten, aluminum, etc.) is then deposited within the openings to form the first and second vias, 112a and 112b.

Therefore, the present disclosure relates to a method of forming a MIM (metal-insulator-metal) capacitor having an interfacial layer that provides for a relatively flat surface upon which a capacitor dielectric material is formed, and an associated apparatus.

In some embodiments, the present disclosure relates to a method of forming a MIM (metal-insulator-metal) capacitor. The method comprises forming a capacitor bottom metal layer comprising a first metal material over a semiconductor substrate. The method further comprises exposing a top surface of the capacitor bottom metal layer to one or more post capacitor bottom metal (CBM) treatment agents comprising oxygen to reduce a roughness of the top surface and to form an interface layer onto and in direct contact with the top surface of the capacitor bottom metal layer, wherein the interface layer comprises the first metal material and oxygen. The method further comprises forming a capacitor dielectric layer over the interface layer, and forming a capacitor top metal layer over the capacitor dielectric layer.

In other embodiments, the present disclosure relates to a method of forming a MIM capacitor. The method comprises forming a capacitor bottom metal layer over a semiconductor substrate using a physical vapor deposition (PVD) process. The method further comprises exposing a top surface of the capacitor bottom metal layer to one or more post capacitor bottom metal (CBM) treatment agents comprising oxygen, wherein the one or more post CBM treatment agents are configured to reduce a roughness of the top surface of the capacitor bottom metal layer and to form an interface layer comprising oxygen onto and in direct contact with the top surface of the capacitor bottom metal layer. The method further comprises forming a capacitor dielectric layer over the interface layer in-situ with exposing the top surface of the capacitor bottom metal layer to the one or more post CBM treatment agents, and forming a capacitor top metal layer over the capacitor dielectric layer. The method further comprises performing a top electrode etch process to remove a portion of the capacitor top metal layer, and performing a bottom electrode etch process to remove a portion of the capacitor dielectric layer and the capacitor bottom metal layer.

In yet other embodiments, the present disclosure relates to a MIM (metal-insulator-metal) capacitor. The MIM capacitor comprises a capacitor bottom metal layer having a first metal material disposed over a semiconductor substrate. An interface layer is disposed onto and in direct contact with a top surface of the capacitor bottom metal layer, wherein the interface layer comprises the first metal material and oxygen. A capacitor dielectric layer disposed over the interface layer, and a capacitor top metal layer is disposed over the capacitor dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a MIM (metal-insulator-metal) capacitor, comprising:
    forming a capacitor bottom metal layer comprising a first metal material over a semiconductor substrate;
    introducing a first gas into a processing chamber comprising the semiconductor substrate, wherein the first gas includes one or more post capacitor bottom metal (CBM) treatment agents comprising oxygen, which reduce a roughness of a top surface of the capacitor bottom metal layer and form an interface layer onto and in direct contact with the top surface of the capacitor bottom metal layer, wherein the interface layer comprises the first metal material and the oxygen;
    forming a capacitor dielectric layer over the interface layer by initially introducing a second gas into the processing chamber in-situ with and in addition to the first gas that is already in and was previously introduced into the processing chamber, wherein the first gas and the second gas are simultaneously present in the processing chamber;
    forming a capacitor top metal layer over the capacitor dielectric layer; and
    performing an etch process that etches the interface layer and that etches the capacitor bottom metal layer to form a capacitor bottom electrode.

2. The method of claim 1, wherein the capacitor bottom metal layer comprises titanium nitride (TiN) or tantalum nitride (TaN).

3. The method of claim 1,
    wherein the interface layer has a first dielectric constant; and
    wherein the capacitor dielectric layer has a second dielectric constant that is different than the first dielectric constant.

4. The method of claim 1, wherein the one or more post CBM treatment agents comprise nitrous-oxide ($N_2O$) or oxygen ($O_2$).

5. The method of claim 1, wherein exposing the top surface of the capacitor bottom metal layer to the one or more post CBM treatment agents, comprises:
    providing the semiconductor substrate to the processing chamber;
    introducing a nitrous-oxide ($N_2O$) gas or an oxygen ($O_2$) gas into the processing chamber; and
    generating a nitrous-oxide ($N_2O$) plasma or an oxygen ($O_2$) plasma from the nitrous-oxide ($N_2O$) gas or the oxygen ($O_2$) gas, wherein the nitrous-oxide ($N_2O$) plasma or the oxygen ($O_2$) plasma is configured to contact the top surface of the capacitor bottom metal layer to form the interface layer.

6. The method of claim 1,
    wherein the interface layer comprises a same material continuously extending between a bottommost surface of the interface layer and a top surface of the interface layer; and
    wherein the interface layer is a different material than the capacitor dielectric layer.

7. The method of claim 1, wherein the one or more post CBM treatment agents comprise ozone gas ($O_3$).

8. The method of claim 1, wherein the capacitor bottom metal layer is formed on and in contact with an underlying etch stop layer.

9. The method of claim 7, wherein exposing the top surface of the capacitor bottom metal layer to the one or more post CBM treatment agents, comprises:
providing the semiconductor substrate to the processing chamber;
introducing the ozone gas ($O_3$) into the processing chamber; and
increasing a temperature within the processing chamber to greater than or equal to approximately 210° C.

10. The method of claim 1,
wherein the top surface of the capacitor bottom metal layer has a first variation in height between a lowest point and an uppermost point; and
wherein a top surface of the interface layer has a second variation in height that is less than the first variation in height.

11. The method of claim 1, wherein the one or more post CBM treatment agents comprise a first CBM treatment agent comprising nitrous-oxide ($N_2O$) or oxygen ($O_2$) gas, and a second CBM treatment agent comprising ozone gas ($O_3$).

12. A method of forming a MIM capacitor, comprising:
forming a capacitor bottom metal layer over a semiconductor substrate using a physical vapor deposition (PVD) process;
directly exposing the capacitor bottom metal layer to a first collection of gas molecules introduced into a processing chamber comprising the semiconductor substrate, wherein the first collection of gas molecules is configured to reduce a roughness of a top surface of the capacitor bottom metal layer and to form an interface layer onto and in direct contact with the top surface of the capacitor bottom metal layer, wherein the interface layer comprises a lower surface having a first roughness facing the semiconductor substrate and an upper surface having a second roughness that is less than the first roughness facing away from the semiconductor substrate;
introducing a second collection of gas molecules into the processing chamber in-situ with and in addition to the first collection of gas molecules to form a capacitor dielectric layer over the interface layer, wherein the first collection of gas molecules and the second collection of gas molecules are simultaneously present in the processing chamber;
forming a capacitor top metal layer over the capacitor dielectric layer;
forming a hard mask over the capacitor top metal layer;
performing a first etch process to remove a portion of the capacitor top metal layer according to the hard mask;
forming a capping layer on sidewalls of the capacitor top metal layer and the hard mask, respectively, and on upper surfaces of the capacitor dielectric layer and the hard mask, respectively;
forming an etch stop layer on upper surfaces and sidewalls of the capping layer;
performing a second etch process to remove a portion of the capacitor dielectric layer, a portion of the interface layer, and a portion of the capacitor bottom metal layer;
forming an inter-level dielectric layer over and laterally surrounding the capping layer; and
forming a first conductive via extending through the inter-level dielectric layer and the hard mask to the capacitor top metal layer and a second conductive via extending through the inter-level dielectric layer, the capacitor dielectric layer, and the interface layer to the capacitor bottom metal layer, wherein the second conductive via has an outermost sidewall that is laterally separated from the capacitor top metal layer by a non-zero space.

13. A method of forming a MIM (metal-insulator-metal) capacitor, comprising:
forming a capacitor bottom metal layer over a semiconductor substrate, wherein a top surface of the capacitor bottom metal layer has a first variation in height between a lowest point and an uppermost point;
exposing the top surface of the capacitor bottom metal layer to a first collection of gas molecules of a nitrous-oxide plasma in a processing chamber to reduce a roughness of the top surface of the capacitor bottom metal layer and to form an interface layer, wherein a top surface of the interface layer has a second variation in height that is less than the first variation in height, wherein the nitrous-oxide plasma is formed using a nitrous-oxide gas flow rate of greater than approximately 10,000 sccm (standard cubic centimeter per minute) to reduce the roughness of the top surface of the capacitor bottom metal layer;
introducing a second collection of gas molecules into the processing chamber in-situ with and in addition to the first collection of gas molecules, wherein the first collection of gas molecules and the second collection of gas molecules are simultaneously present in the processing chamber, to form a capacitor dielectric layer onto the interface layer, wherein the interface layer directly contacts the capacitor dielectric layer and the capacitor bottom metal layer; and
forming a capacitor top metal layer over the capacitor dielectric layer.

14. The method of claim 13, wherein the semiconductor substrate is disposed within the processing chamber, which is held at a temperature greater than or equal to approximately 400° C. during formation of the nitrous-oxide plasma.

15. The method of claim 13, further comprising:
performing an etch process that etches the interface layer and that etches the capacitor bottom metal layer to form a capacitor bottom electrode.

16. The method of claim 1, wherein the capacitor bottom metal layer comprises a grain boundary disposed between a first column-like structure having a first height and a second column-like structure having a second height that is different from the first height, wherein the grain boundary contacts both the first column-like structure and the second column-like structure.

17. The method of claim 1, wherein the capacitor bottom metal layer is deposited by way of a multi-step deposition process.

18. The method of claim 13, wherein the capacitor bottom metal layer is deposited directly over a first etch stop layer continuously extending between outermost sidewalls of the capacitor bottom metal layer.

19. The method of claim 1, further comprising:
forming a capping layer contacting an upper surface of the capacitor dielectric layer; and
forming an etch stop layer contacting an upper surface and sidewalls of the capping layer; and forming an inter-level dielectric layer contacting sidewalls and an upper surface of the etch stop layer.

20. The method of claim 1, wherein the second gas comprises Tetrakis(ethylmethylamido)zirconium.

* * * * *